US008260727B2

(12) United States Patent
Koga et al.

(10) Patent No.: US 8,260,727 B2
(45) Date of Patent: Sep. 4, 2012

(54) METHOD AND APPARATUS FOR ESTIMATING A FACTOR/DEFECT AFFECTING QUALITY/RELIABILITY WHEREIN THE PRIORITY OF USER INPUT DATA IS DETERMINED

(75) Inventors: Junpei Koga, Nagaokakyo (JP);
Yasuaki Nakajima, Takatsuki (JP);
Kazuto Kojitani, Osaka (JP)

(73) Assignee: Omron Corporation, Kyoto (JP)

( * ) Notice: Subject to any disclaimer, the term of this patent is extended or adjusted under 35 U.S.C. 154(b) by 1554 days.

(21) Appl. No.: 11/695,926

(22) Filed: Apr. 3, 2007

(65) Prior Publication Data

US 2007/0239651 A1    Oct. 11, 2007

(30) Foreign Application Priority Data

Apr. 3, 2006    (JP) ................ P2006-102239

(51) Int. Cl.
*G06F 15/18*    (2006.01)
(52) U.S. Cl. .......................................... 706/12
(58) Field of Classification Search ............... 706/12, 706/45, 62; 700/110, 121, 143
See application file for complete search history.

(56) References Cited

U.S. PATENT DOCUMENTS

| | | | |
|---|---|---|---|
| 4,837,734 A | | 6/1989 | Ichikawa et al. |
| 5,544,256 A * | | 8/1996 | Brecher et al. .............. 382/149 |
| 6,978,041 B2 * | | 12/2005 | Isogai et al. .............. 382/149 |
| 2007/0105245 A1 * | | 5/2007 | Funakoshi et al. ............ 438/14 |

FOREIGN PATENT DOCUMENTS

| | | |
|---|---|---|
| FR | 2 692 377 | 12/1993 |
| JP | 01-224842 | 9/1989 |
| JP | 04-317132 | 11/1992 |
| JP | 06-174503 | 6/1994 |
| JP | 3511632 | 1/2004 |
| JP | 2004-118693 | 4/2004 |
| JP | 2005-301582 | 10/2005 |

OTHER PUBLICATIONS

European Patent Office Communication pursuant to Article 94(3) EPC dated Oct. 19, 2011; 8 pages.
European Patent Office extended European search report on application No. 07006991.9 dated Oct. 8, 2010; 7 pages.

* cited by examiner

*Primary Examiner* — David Vincent
(74) *Attorney, Agent, or Firm* — Foley & Lardner LLP

(57) ABSTRACT

A factor estimation apparatus which can appropriately estimate a factor without increase in the cost, the factor estimation apparatus includes a characteristic quantity determination unit which determines the characteristic quantity; a user input unit which accepts an input from a user as data for the characteristic quantity determined by the characteristic quantity determination unit; an apparatus-data input unit to which data is inputted from a data obtaining device as the data for the characteristic quantity determined by the characteristic quantity determination unit; an input source defining unit which previously determines that the data for the characteristic quantity is inputted from which one of the user input unit and the apparatus-data input unit; and an estimation unit which estimates the factor using the data inputted from the input unit determined by the input source defining unit.

6 Claims, 17 Drawing Sheets

Fig. 4A

Rule data — 31

```
P0001
IF ( T0001=TRUE AND T0030=LARGE ) THEN P0006=TRUE
IF ( T0002=TRUE AND T0030=LARGE ) THEN P0007=TRUE
IF ( T0003=TRUE AND T0032=LARGE ) THEN P0008=TRUE
IF ( T0004=LARGE AND T0035=LARGE ) THEN P0009=TRUE
IF ( T0005=LARGE AND T0078=LARGE ) THEN P0011=TRUE
IF ( T0006=TRUE AND T0100=LARGE ) THEN P0013=TRUE
     ...
P0002
IF ( T0012=TRUE AND T0030=LARGE ) THEN P0039=TRUE
     ...
```

Fig. 4B

Phenomenon data — 32

| Phenomenon ID | Phenomenon name |
|---|---|
| P0001 | Bridge |
| P0002 | Component shift |
| P0003 | Excessive fillet |
| P0004 | Lacking fillet |
| P0005 | Solder wetting defect |
| P0006 | Solder position shift is present after printing |
| P0007 | Solder bleeding is present after printing |
| P0008 | Solder dripping is present after printing |
| P0009 | Solder area is excessively large after printing |
| ... | ... |

Fig. 4C Characteristic quantity data

| Characteristic ID | Intracharacteristic sequence number | Obtaining method | Choice 1 | Input 1 | Choice 2 | Input 2 | Threshold |
|---|---|---|---|---|---|---|---|
| T0001 | 1 | See image in P process of defective occurrence portion. Solder is shifted? | Shifted | TRUE | Not shifted | FALSE | — |
| T0001 | 2 | Printing machine inspection: shift inspection | — | TRUE | — | FALSE | 5 |
| T0002 | 1 | See image in P process of defective occurrence portion. Solder is dripped? | Dripped | TRUE | Not dripped | FALSE | — |
| T0002 | 2 | Printing machine inspection: print area inspection | — | TRUE | — | FALSE | 120 |
| T0003 | 1 | See image in P process of defective occurrence portion. Solder print height is high or low on the whole? | High on the whole | LARGE | Low on the whole | SMALL | — |
| ... | | ... | ... | ... | ... | ... | ... |

Fig. 4D
Inquiry screen

See inspection image in P process. "Bleeding" is present in print solder of the same point as defect occurring?
Present/absent

Fig. 5

Input source defining table

| Characteristic ID | Intra-characteristic ID sequence number | Input source |
|---|---|---|
| T0001 | 1 | Person |
| T0001 | 2 | Sensor data |
| T0002 | 1 | Person |
| T0002 | 2 | Sensor data |
| T0003 | 1 | Person |
| ⋮ | ⋮ | ⋮ |

Fig. 7

| Characteristic ID | Intra-characteristic ID sequence number | Order of priority | Input source |
|---|---|---|---|
| T0001 | 1 | 2 | Person |
| T0001 | 2 | 1 | Sensor data |
| T0002 | 1 | 1 | Person |
| T0002 | 2 | 2 | Sensor data |
| T0003 | 1 | 1 | Person |
| ⋮ | | | ⋮ |

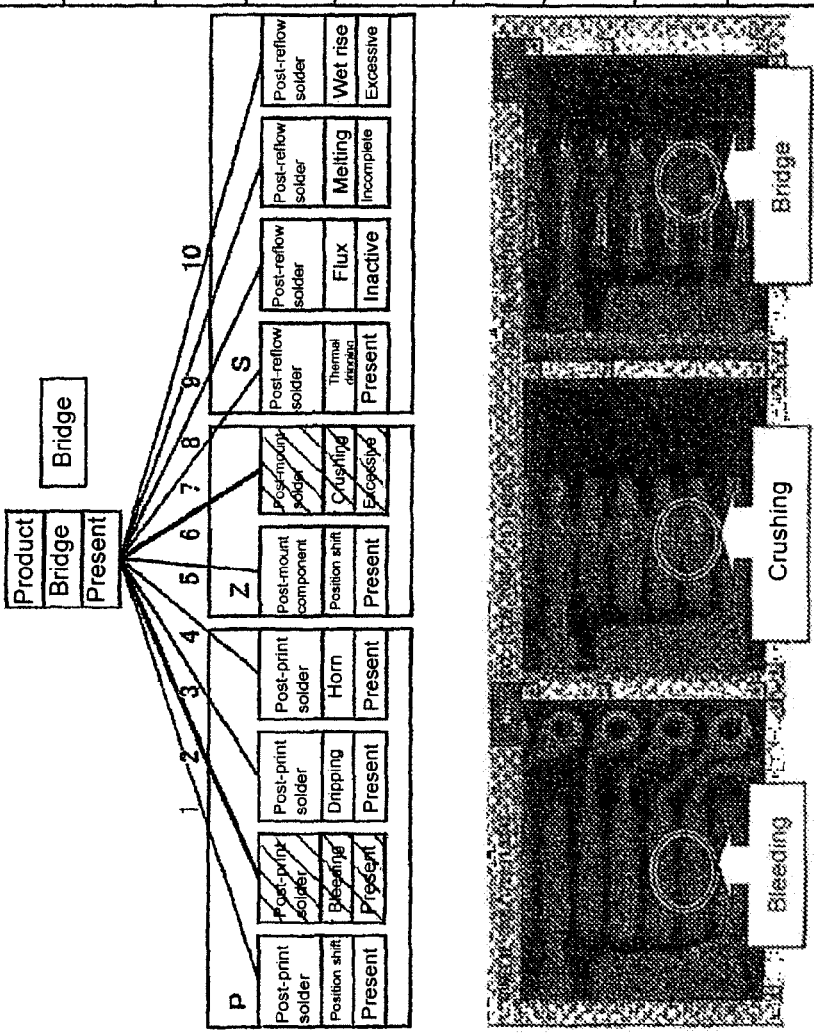

Fig. 11A

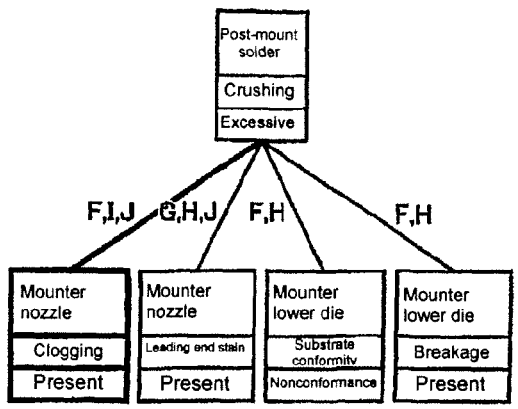

Fig. 11B

| ID | Question sentences | Response |
|---|---|---|
| F | Compare inspection image of substrate in Z process with those at the same portions as defect occurrence portion of last substrate and second-last substrate. Similar solder crushing is generated in last substrate and second-last substrate? | Generated |
| G | Compare inspection image of substrate in Z process with those at the same portions as defect occurrence portion of last substrate and second-last substrate. Similar solder crushing is generated only in substrate where defect occurred? | Defect occurs in other substrate |
| H | Compare inspection image of component kind where defect occurred in Z process with the same component kinds located far away from and close to component kind where defect occurred. Similar solder crushing is generated? | Not generated |
| I | Select the same component kind as component kind where defect occurred from whole of substrate to compare inspection images in Z process. Similar solder crushing is generated? | Generated |
| J | Select component with which the same nozzle is used as component kind where defect occurred while being different in kind from component kind where defect occurred, to compare inspection images in Z process. Similar solder crushing is generated? | Generated |

Fig. 12A

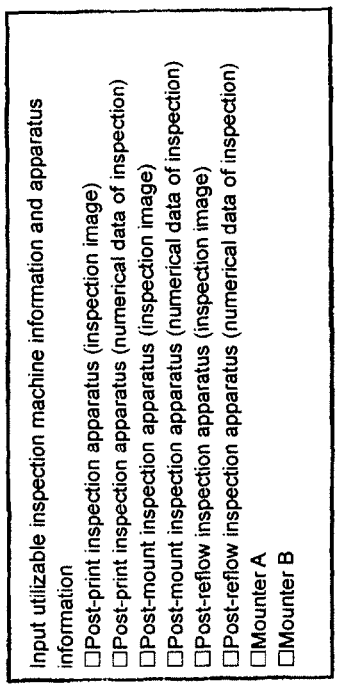

Input utilizable inspection machine information and apparatus information
☐Post-print inspection apparatus (inspection image)
☐Post-print inspection apparatus (numerical data of inspection)
☐Post-mount inspection apparatus (inspection image)
☐Post-mount inspection apparatus (numerical data of inspection)
☐Post-reflow inspection apparatus (inspection image)
☐Post-reflow inspection apparatus (numerical data of inspection)
☐Mounter A
☐Mounter B

Fig. 12B

| Characteristic ID | Intra-characteristic ID sequence number | Order of priority | Input source | Post-print inspection apparatus (inspection image) | Post-print inspection apparatus (numerical data of inspection) | Post-mount inspection apparatus (inspection image) | Post-mount inspection apparatus (numerical data of inspection) | Post-reflow inspection apparatus (inspection image) | Post-reflow inspection apparatus (numerical data of inspection) | Mounter A | Mounter B |
|---|---|---|---|---|---|---|---|---|---|---|---|
| T0001 | 1 | 2 | Person | ○ | — | — | — | — | — | — | — |
| T0001 | 2 | 1 | Sensor data | — | ○ | — | — | — | — | — | — |
| T0002 | 1 | 1 | Person | — | ○ | — | — | — | — | — | — |
| T0002 | 2 | 2 | Sensor data | ○ | — | — | — | — | — | — | — |
| ・・・ | ・・・ | ・・・ | | ・・・ | ・・・ | ・・・ | ・・・ | ・・・ | ・・・ | | |

Input utilizable production phase information and apparatus information
☐ Preproduction phase
☐ Mass production phase
☐ Mounter A
☐ Mounter B

| Phenomenon ID | Preproduction phase | Mass production phase | Mounter A | Mounter B | ... |
|---|---|---|---|---|---|
| P0301 | ○ | — | ○ | — | ... |
| P0302 | ○ | — | ○ | — | ... |
| P0303 | — | ○ | — | ○ | ... |
| P0304 | — | ○ | — | — | ... |
| ... | | | | | |

Fig. 17A

| | Preproduction phase | Massproduction phase | Mounter A | Mounter B |
|---|---|---|---|---|
| Mass production phase of line A | — | ○ | ○ | — |
| Preproduction phase of line B | ○ | — | — | ○ |

Fig. 17B
Correlation among phenomenon, production phase, and apparatus data

| Phenomenon ID | Preproduction phase | Massproduction phase | Mounter A | Mounter B |
|---|---|---|---|---|
| P0301 | ○ | — | ○ | — |
| P0302 | ○ | — | ○ | — |
| P0303 | ○ | ○ | — | ○ |
| P0304 | — | ○ | — | — |
| ... | ... | ... | ... | ... |

Fig. 17C
Correlation among phenomenon, obtainable inspection data, and apparatus data

| Characteristic ID | T0004 | T0004 | T0005 | T0005 | ... |
|---|---|---|---|---|---|
| Intra-characteristic ID sequence number | 1 | 2 | 1 | 2 | ... |
| Order of priority | 2 | 1 | 2 | 1 | ... |
| Post-print inspection apparatus (inspection image) | — | — | — | — | ... |
| Post-print inspection apparatus (numerical data of inspection) | — | — | — | — | ... |
| Post-mount inspection apparatus (inspection image) | ○ | — | ○ | — | ... |
| Post-mount inspection apparatus (numerical data of inspection) | — | ○ | — | ○ | ... |
| Post-reflow inspection apparatus (inspection image) | — | — | — | — | ... |
| Post-reflow inspection apparatus (numerical data of inspection) | — | — | — | — | ... |
| Mounter A | ○ | ○ | — | — | ... |
| Mounter B | — | — | — | — | ... |

Fig. 18A

Valid factor defining table 51

| Phenomenon ID | Preproduction phase | Massproduction phase | Mounter A | Mounter B | ... |
|---|---|---|---|---|---|
| P0301 | ⊙ | — | ⊙ | — | ... |
| P0302 | ⊙ | — | ○ | — | ... |
| P0303 | — | ○ | — | ○ | ... |
| P0304 | — | ○ | — | — | ... |
| ... | ... | ... | ... | ... | ... |

51a: P0301, P0302 (Usable)
51b: P0303, P0304 (Unusable — Deletion)

Narrow down factor →

Fig. 18B

Rule data 52

```
P0001
  IF ( T0001=TRUE AND T0030=LARGE ) THEN P0006=TRUE
  IF ( T0002=TRUE AND T0030=LARGE ) THEN P0007=TRUE
    .
    .
    .
P0002
  IF
P0200
  IF ( T0110=TRUE AND T0120=LARGE ) THEN P0301=TRUE
  IF ( T0111=TRUE AND T0120=LARGE ) THEN P0302=TRUE
  IF ( T0112=TRUE AND T0122=LARGE ) THEN P0303=TRUE
  IF ( T0113=TRUE AND T0141=LARGE ) THEN P0304=TRUE
```

52a: P0301, P0302 brace
52b: P0303, P0304 brace

| Characteristic ID | Intra-characteristic ID sequence number | Order of priority | Post-print inspection apparatus (inspection image) | Post-print inspection apparatus (numerical data of inspection) | Post-mount inspection apparatus (inspection image) | Post-mount inspection apparatus (numerical data of inspection) | Post-reflow inspection apparatus (inspection image) | Post-reflow inspection apparatus (numerical data of inspection) | Mounter A | Mounter B |
|---|---|---|---|---|---|---|---|---|---|---|
| T0001 | 1 | 2 | ○ | — | — | — | — | — | — | — |
| T0001 | 2 | 1 | — | ○ | — | — | — | — | — | — |
| T0002 | 1 | 2 | ○ | — | — | — | — | — | — | — |
| T0002 | 2 | 1 | — | ○ | — | — | — | — | — | — |
| T0200 | 1 | 1 | ○ | — | — | — | — | — | — | — |
| ... | ... | ... | ... | ... | ... | ... | ... | ... | ... | ... |

53a: T0001 (seq 1) — Usable
53b: T0001 (seq 2)
54a: T0002 (seq 1)
54b: T0002 (seq 2) — Unusable

METHOD AND APPARATUS FOR ESTIMATING A FACTOR/DEFECT AFFECTING QUALITY/RELIABILITY WHEREIN THE PRIORITY OF USER INPUT DATA IS DETERMINED

This application claims priority from Japanese patent application P2006-102239, filed on Apr. 3, 2006. The entire contents of the aforementioned application is incorporated herein by reference.

BACKGROUND OF THE INVENTION

1. Field of the Invention

The present invention relates to a factor estimation apparatus, a factor estimation method, and a computer readable recording medium, particularly to a factor estimation apparatus, a factor estimation method, a program, and a computer readable recording medium, capable of appropriately estimating a factor.

2. Description of the Related Art

Conventionally, there is known a diagnostic expert system in which a factor estimation apparatus is used to estimate the defective factor in a production process. In such an expert system, data input concerning the defect is accepted in a dialogue manner with a user such that the user is asked a predetermined question and a response is obtained from the user, and the defective factor is estimated using a knowledge base. However, sometimes an appropriate response cannot be obtained depending on the user's skill. For example, in Japanese Patent No. 3511632, the data is inputted only from an inspection machine in order to deal with such cases.

The conventional expert system utilizing a factor estimation apparatus is configured as described above. Therefore, in Japanese Patent No. 3511632, a sensor is required because the data is inputted from the inspection machine, which results in a problem of increase in the cost. Even if the data from the inspection machine can be used in place of the dialogue with the user, sometimes a different knowledge base or a characteristic extraction operation is required depending on a difference in target systems and the presence or absence of a data detection apparatus such as a sensor or a camera.

In view of the foregoing problems, an object of the present invention is to provide a factor estimation apparatus, a factor estimation method, a program, and a computer readable recording medium in which the program is stored, capable of appropriately estimating a factor without a cost increase.

SUMMARY OF THE INVENTION

A first aspect of the present invention provides a factor estimation apparatus which estimates a factor affecting a phenomenon based on data for a characteristic quantity associated with the phenomenon, the factor estimation apparatus including a characteristic quantity determination unit which determines the characteristic quantity, a user input unit which accepts an input from a user as data for the characteristic quantity determined by the characteristic quantity determination unit, an apparatus-data input unit to which data is inputted from a data obtaining device as the data for the characteristic quantity determined by the characteristic quantity determination unit, an input source defining unit which previously determines that the data for the characteristic quantity is inputted from which one of the user input unit and the apparatus-data input unit, and an estimation unit which estimates the factor using the data inputted from the input unit determined by the input source defining unit.

According to the first aspect of the present invention, it is previously determined that the data for the predetermined characteristic quantity is inputted from which one of the user input unit and the apparatus-data input unit. Therefore, when an appropriate determination is made according to a difference in the target system for which the factor is estimated or a difference in skill of a user who makes a diagnosis, an appropriate data for estimating the factor is obtained using the inputted data. As a result, a factor estimation apparatus capable of appropriately estimating a factor can be provided without increase in the cost.

In the factor estimation apparatus according to the first aspect of the present invention, it is preferred that the plurality of characteristic quantities exist, the estimation unit estimates the factor based on the plurality of characteristic quantities, and the input source defining unit includes a priority determination unit which previously determines that a priority is assigned to the data inputted from which one of the user input unit and the apparatus-data input unit for the plurality of characteristic quantities.

In the factor estimation apparatus according to the first aspect of the present invention, it is further preferred that the priority determination unit includes a reliability determination unit which determines reliability of the input data of each of both the input units, and the priority determination unit determines that the priority is assigned to the data inputted from which one of the user input unit and the apparatus-data input unit according to the determination result of the reliability determination unit.

In the factor estimation apparatus according to the first aspect of the present invention, the reliability determination unit preferably determines the reliability from a skill or a role of a user.

In the factor estimation apparatus according to the first aspect of the present invention, the input source defining unit preferably determines previously that the data is inputted from which one of the user input unit and the apparatus-data input unit for the plurality of characteristic quantities according to a target system for which the factor is estimated.

In the factor estimation apparatus according to the first aspect of the present invention, it is preferred that the target system is operated in a plurality of operational phases, the factor estimation apparatus includes an operational phase input unit which prompts a user to input the operational phase and the usable data obtaining device in the target system, and a valid factor defining unit which stores the operational phase and the data obtaining device inputted to the operational phase input unit in association with the phenomenon.

A second aspect according to the present invention provides a factor estimation method of estimating a factor affecting a phenomenon based on data for a characteristic quantity associated with the phenomenon, the factor estimation method including the steps of determining previously that the data for the characteristic quantity is inputted from which one of a user input unit and a data obtaining device, determining the characteristic quantity, inputting the data for the characteristic quantity from previously determined one of the user input unit and the data obtaining device, and estimating the factor affecting the phenomenon using the inputted data.

A third aspect according to the present invention provides a computer readable recording medium in which a program for making a computer to execute the above described factor estimation method can be stored.

BRIEF DESCRIPTION OF THE DRAWINGS

FIGS. 4A, 4B, 4C and 4D show contents of the knowledge base;

FIG. 5 shows an input source defining table;

FIG. 7 shows an input source defining table;

FIGS. 9A and 9B show inference methods in the case of occurrence of a "bridge";

FIGS. 11A and 11B show methods of specifying a secondary factor;

FIGS. 12A and 12B show input source defining tables;

FIGS. 17A, 17B and 17C show illustrations of a switch in characteristic quantities or factors; and FIGS. 18A, 18B and 18C show valid factor defining tables.

DETAILED DESCRIPTION OF THE PREFERRED EMBODIMENTS

Embodiments according to the present invention will be described below with reference to the accompanying drawings.

First Embodiment

Figure 1:
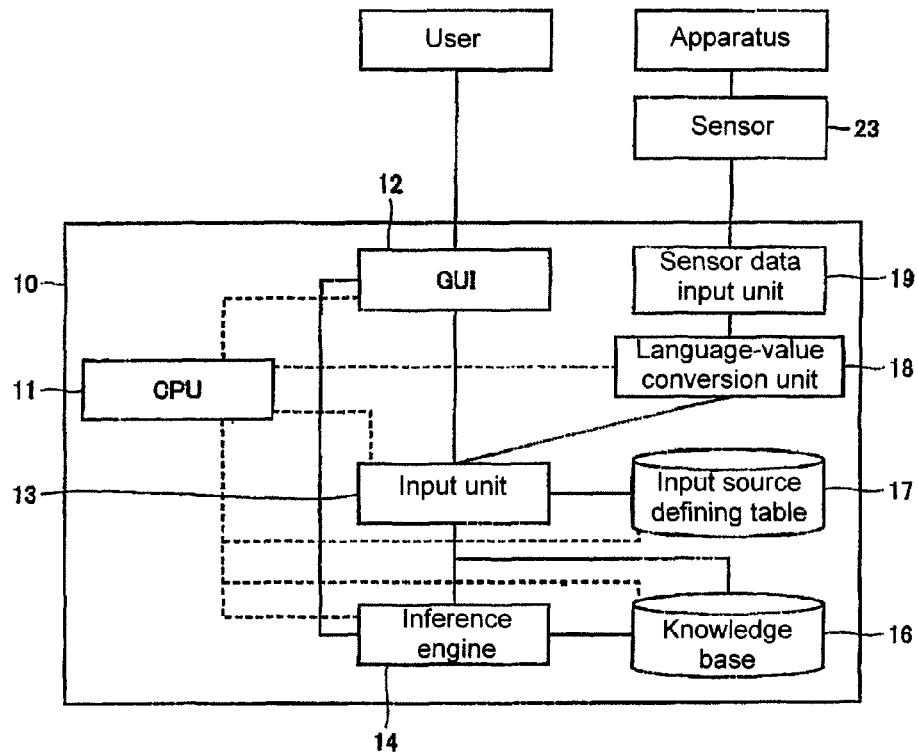
FIG. 1 shows a functional block diagram of a factor estimation apparatus according to a first embodiment of the present invention.

FIG. 1 shows a functional block diagram of a factor estimation apparatus according to a first embodiment of the present invention. As shown in FIG. 1, a factor estimation apparatus 10 is an apparatus which estimates a factor for a phenomenon such as a defect that occurred in a production process or the like, using data for a predetermined characteristic quantity concerning the phenomenon. Referring to FIG. 1, the factor estimation apparatus 10 includes an interface which receives data from a user and a sensor 23 provided in a production process.

The factor estimation apparatus 10 includes a graphic user interface (GUI) 12 which serves as an interface with a user, an input unit 13 connected to GUI 12, an inference engine 14 connected to the input unit 13, and a knowledge base 16 connected to the inference engine 14. The input unit 13 is connected to an input source defining table 17 and a language-value conversion unit 18. The inference engine 14 estimates a defective factor generated in the production process based on the knowledge base 16. On the other hand, the data from the sensor 23 is inputted to a sensor data input unit 19, the data is converted by the language-value conversion unit 18, and the converted data is inputted to the input unit 13.

The language-value conversion unit 18 converts the data inputted to the sensor data input unit 19 from the sensor 23 into the data which can be inferred by the inference engine 14. Specifically, for example, when 0.8 is the data from the sensor 23, it is assumed that the inference engine 14 performs an inference using whether the data is H (high) or L (low). At this point, the language-value conversion unit 18 has a predetermined threshold, and the language-value conversion unit 18 converts the inputted sensor data of 0.8 into either of H and L.

GUI 12 includes a display unit and an input unit, and GUI 12 functions as a user input unit (user input device) for accepting the input from the user. The display unit, such as a display device, displays an image for the user. The user uses the input unit, such as a keyboard and a mouse, to perform input while seeing the display.

The input source defining table (input source defining unit) 17 is a table which is used for determining that the data inputted to the input unit 13 is received through GUI 12 from which one of the user and the sensor data input unit 19. GUI 12 may accept input using a file other than those mentioned above or an input device such as a speech interface.

Specifically, the factor estimation apparatus 10 is a computer including a CPU 11, the inference engine 14 and the language-value conversion unit 18 are programs, and the knowledge base 16 is stored in a storage unit (not shown) such as a hard disk. The inference engine 14 functions as a characteristic quantity determination unit and an estimation unit.

Hereinafter, the system to be a target for which the factor is estimated is referred to as target system. Here, the input from the sensor 23 included in an inspection apparatus (not shown) is described as the input from the target system. However, the present invention is not limited thereto, and the data may be inputted from any data obtaining device through which the data can be obtained, such as a camera for taking an image of the inspection target. Therefore, the sensor data input unit 19 functions as an apparatus-data input unit.

A method of specifically estimating the factor using the factor estimation apparatus 10 shown in FIG. 1 will be described below. The factor estimation apparatus 10 is operated as a so-called expert system which estimates the defective factor in a production process. Although there are many kinds of expert systems, the expert system which specifies a defective factor in a substrate mounting line of electronic component mounting equipment will be described herein.

Figure 2:
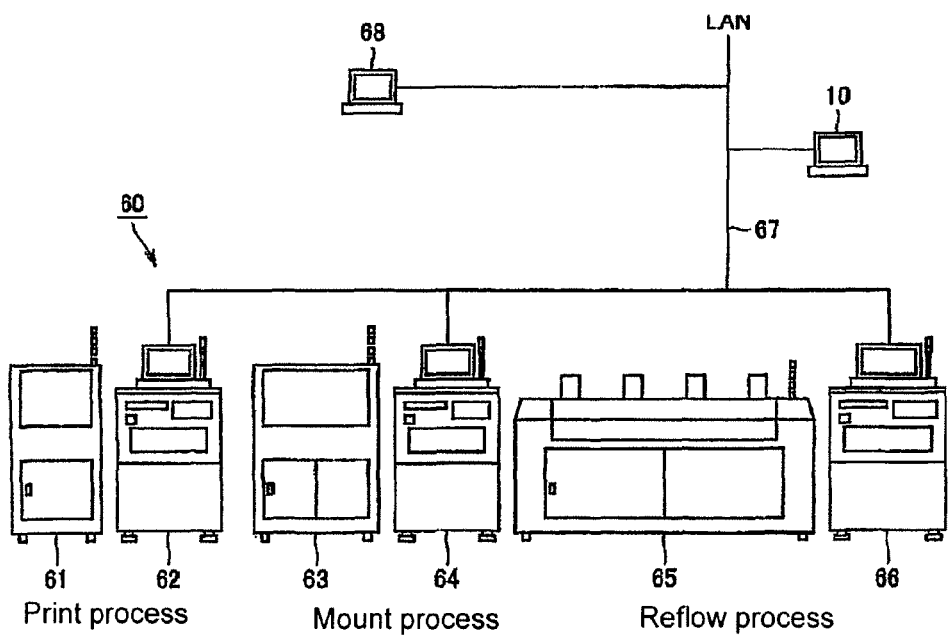
FIG. 2 shows a substrate mounting line.

FIG. 2 shows a substrate mounting line. Referring to FIG. 2, the substrate mounting line 60 includes a print process, a mount process, and a reflow process which are arranged from the upstream side toward the down stream side of the line along which a substrate to be mounted with electronic components flows. The processes are connected by a conveyer, a robot, and other conveyance apparatuses. The apparatus for processing the process is provided in each process.

A print machine 61 and a post-print inspection apparatus 62 are provided in the print process. The print machine 61 prints solder on a land of a substrate, and the post-print inspection apparatus 62 performs an inspection after printing. A mounter 63 and a post-mount inspection apparatus 64 are provided in the mount process. The mounter 63 mounts a component on a substrate, and the post-mount inspection apparatus 64 performs an inspection after mounting. A reflow furnace 65 and a post-reflow inspection apparatus 66 are provided in the reflow process. The reflow furnace 65 solders a terminal of a component onto a land, and the post-reflow inspection apparatus 66 performs an inspection after soldering.

The print machine 61, the post-print inspection apparatus 62, the mounter 63, the post-mount inspection apparatus 64, the reflow furnace 65, and the post-reflow inspection apparatus 66 are connected to the factor estimation apparatus 10 and an inspection information storage device 68 through LAN 67.

The inspection results including inspection images in the processes are transmitted to the inspection information storage device 68 from the post-print inspection apparatus 62, the post-mount inspection apparatus 64, and the post-reflow inspection apparatus 66, and the inspection results are stored in the inspection information storage device 68. The inspection result is read from the factor estimation apparatus 10 if needed.

The defect includes a bridge (solder adheres to cause short-circuit of electrodes of a component), a wet defect (defect is in the connection between solder and a land or between solder and a component electrode), a fillet anomaly (due to excessive or lacking solder amount, the outline of solder in sectional view does not form a clear mound shape), and a lack of component (component is absent).

Here, the user sees the data from the sensor 23 of the inspection apparatus provided in the substrate mounting line or the inspection image from the camera, and the user input the determination result to perform the factor estimation.

Figure 3:
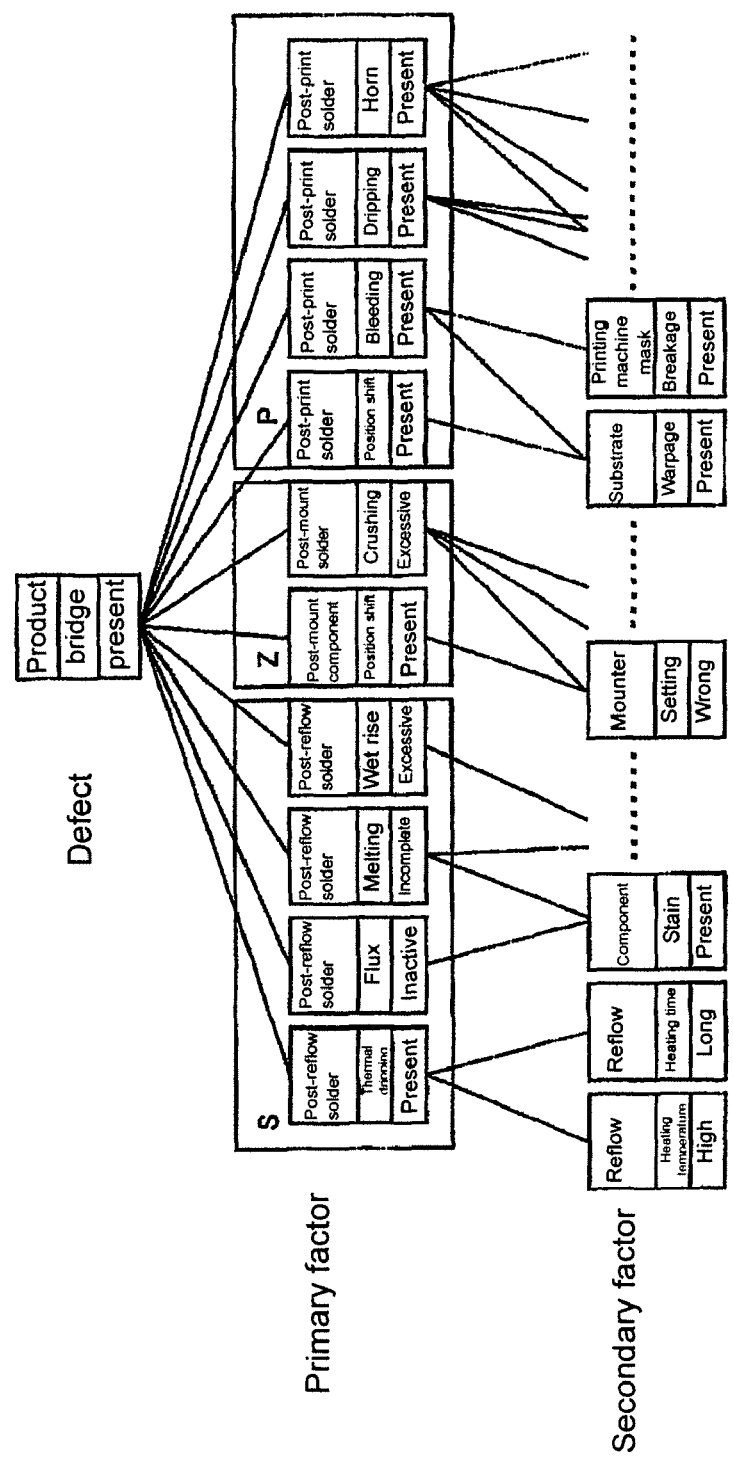
FIG. 3 shows an example of a knowledge base used for specifying a defective factor in the substrate mounting line.

Then, contents of the knowledge base 16 will be described. FIG. 3 shows an example of a knowledge base 16 used to specify the defective factor in the substrate mounting line. Referring to FIG. 3, the knowledge base 16 has a three-layer structure. The first layer indicates the defect of a product after the product passes through the production line, and the "bridge" is indicated as the defect in this case. The second layer indicates a fault phenomenon exhibited in the product in production as a primary factor of the defect. The third layer indicates a fault in the process equipment or in a material used as a secondary factor of the defect which is the cause of the primary factor.

Then, a structure of the knowledge base 16 will be described. FIG. 4A shows rule data 31 included in the knowledge base 16. For example, conditions are listed in the case where it is determined that the phenomenon is the "bridge" (phenomenon ID is P0001, see FIG. 4B). As shown in FIG. 4A, rule data 31 has an IF to THEN rule including characteristic quantity data in which a characteristic ID is indicated by T0001, T0002, T0003, . . . . That is, the phenomenon to be the factor can be estimated by the presence or absence of a characteristic quantity. The characteristic ID is one which specifies a characteristic quantity associated with a defect-like phenomenon.

FIG. 4B shows phenomenon data 32. The phenomenon data 32 constitutes a factor indicating a causal relationship in the factor estimation apparatus 10. FIG. 4C shows a method of obtaining the characteristic quantity data shown in FIG. 4A.

Referring to FIG. 4C, characteristic quantities are distinguished by characteristic IDs, and each characteristic ID includes an intra-characteristic ID sequence number, an obtaining method, a pair of an alternative displayed for the user and data inputted from the user, and a threshold for converting a numerical input from the sensor 23 into a language value.

The intra-characteristic ID sequence number 1 indicates the case where the data is obtained for each characteristic ID through the dialogue with the user, and the intra-characteristic ID sequence number 1 includes choices for a question to the user and the input thereof. The input is computed as TRUE when exceeding the threshold, and is computed as FALSE when not exceeding the threshold. The intra-characteristic ID sequence number 2 indicates that the data is inputted from the sensor of the inspection apparatus.

Thus, the method of inputting the data through the dialogue with the user and the method of inputting the data from the inspection apparatus are prepared in order to obtain the one piece of characteristic quantity data.

FIG. 4D shows an example of the case in which the question content is displayed on a display device (not shown) as the obtaining method shown in FIG. 4C. FIG. 4D shows the question screen in the case where the characteristic ID is T0001 in FIG. 4C.

FIG. 5 shows contents of the input source defining table 17 in FIG. 1. As shown in FIG. 5, in the input source defining table 17, it is previously determined as an input source that the data is inputted from which one of the user (person) and the sensor 23 for each characteristic ID using the intra-characteristic ID sequence number.

Figure 6:
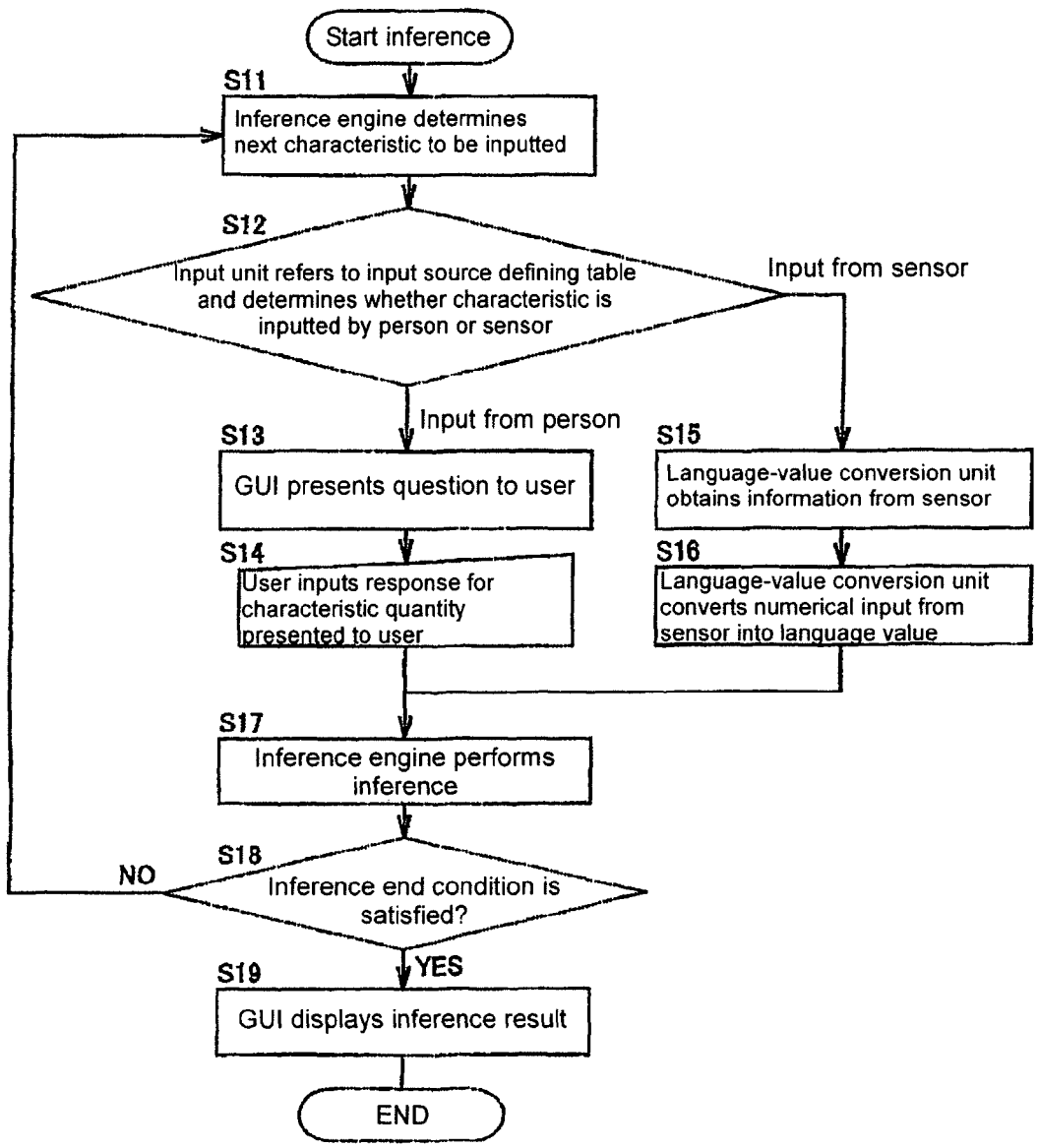
FIG. 6 shows a flowchart of the operation of the factor estimation apparatus according to the first embodiment of the present invention.

FIG. 6 shows a flowchart illustrating operation of the factor estimation apparatus 10 according to the present embodiment (specifically, the operation of CPU 11). Referring to FIG. 6, in the factor estimation apparatus 10, the inference engine 14 determines the characteristic to be inputted next (Step S11, hereinafter "Step" is omitted). Therefore, the inference engine 14 functions as a characteristic quantity determination unit. The input unit 13 refers to the input source defining table 17 to determine whether the characteristic is inputted by the user or the sensor (S12).

When the characteristic is inputted by the user, GUI 12 displays the contents of the question to the user on the display device (not shown) (S13), and the user inputs a response for the characteristic quantity presented to the user (S14).

When the characteristic is inputted from the sensor 23, the language-value conversion unit 18 obtains the data from the sensor 23 through the sensor data input unit 19 (S15), and the language-value conversion unit 18 converts the numerical data from the sensor 23 into the language value (S16). The data is automatically inputted from the sensor 23.

The inference engine 14 performs an inference based on the data inputted one of the user and the sensor 23 (S17). The inference engine 14 continues the inference until the inference end condition is satisfied (YES in S18), and GUI 12 displays the inference result to the user (S19).

According to the present embodiment, the data concerning the characteristic quantity is inputted from one of the user and the sensor according to the contents of the input source defining table 17, and the inference engine 14 estimates the factor according to the input. Therefore, the characteristic quantity data can appropriately be inputted when the data to be inputted is previously determined according to the difference in the target system or the user's skill. As a result, deterioration in diagnostic performance caused by the improper input can be reduced, and cost required for the input can be reduced.

In the case where the factor is estimated in the target system, the input source for the input source defining table 17 is preferably determined by taking into consideration, e.g., the product manufactured, materials, parameters, adjustment performed by an operator, and maintenance.

Second Embodiment

A second embodiment of the present invention will be described below. The factor estimation apparatus 10 of the second embodiment has the same basic configuration as that of the first embodiment shown in FIG. 1. In the second embodiment, the data is inputted for a plurality of characteristic quantities, and the factor is estimated by combination of the characteristic quantities.

FIG. 7 shows an input source defining table 17 of the second embodiment. Referring to FIG. 7, the input source defining table 17 has two inputs specified by the intra-characteristic ID sequence number for each characteristic ID. The intra-characteristic ID sequence number 1 specifies the person as the input source, and the intra-characteristic ID sequence number 2 specifies the sensor data from the sensor 23 as the input source. Additionally, in the second embodiment, whether a priority is assigned to the person or the sensor data is specified by order of priority. For example, when the characteristic ID is T0001, the sensor data has the order of priority 1 and the person has the order of priority 2, so that the sensor data has the priority.

Figure 8:
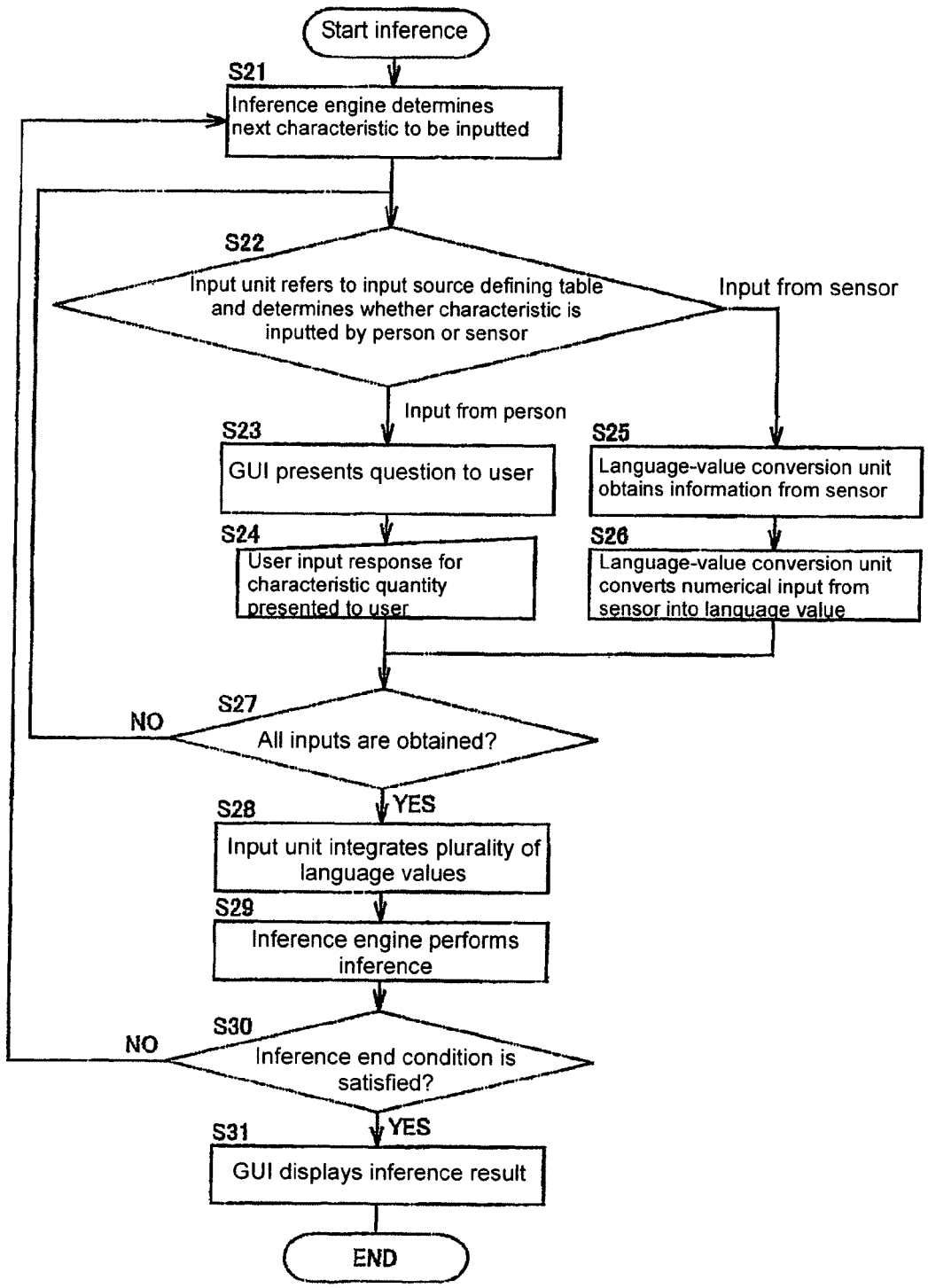
FIG. 8 shows a flowchart of the operation of a factor estimation apparatus according to a second embodiment of the present invention.

FIG. 8 shows a flowchart of the operation performed by CPU 11 in the second embodiment. Referring to FIG. 8, the second embodiment differs from the first embodiment in that a plurality of pieces of data are inputted, as described above. Accordingly, since S21 to S26 in FIG. 8 are similar to S11 to S16 in FIG. 6, the description is omitted.

In the second embodiment, when the operation proceeds from S24 or S26 to S27, in order to obtain a plurality of inputs, it is determined whether or not the necessary input has been obtained. When the necessary input has not been obtained, the process goes to S22, and the next data is inputted. When the necessary input is obtained in S27, the input unit 13 integrates the inputted plurality of language values (S28), and the inference engine 14 performs inference (S29). Then, it is determined whether or not the inference end condition is satisfied (S30). GUI 12 displays the inference result.

Thus, in the second embodiment, since the factor is estimated using a plurality of characteristic quantities, the accuracy of the factor estimation is enhanced. Additionally, since the priority is previously assigned to one of the data input from the person and the data input from the sensor, the accuracy of the factor estimation is further enhanced when the priority is appropriately assigned.

The specific method of estimating the factor will be described below. FIG. 9 shows an illustration of an inference method performed by the factor estimation apparatus 10 when the "bridge" occurs as an example of the defect in the electronic component mounting equipment. FIG. 9A shows the defect and the primary factor shown in FIG. 2, FIG. 9B shows examples of question sentences presented to the user and of responses from the user for making diagnosis (estimating) of the primary factor, and FIG. 9C shows an inspection image in the print process which is displayed along with the question sentences shown in FIG. 9B. The inspection image is stored in the inspection information storage device 68 shown in FIG. 2, and the inspection image is taken out from the inspection information storage device 68 if needed. The inspection image may directly be stored in the knowledge base 16. Thus, the information is obtained from the user while the inspection image etc. from the inspection apparatus is displayed, which allows the correct information to be inputted to perform appropriate inference.

Referring to FIG. 9B, significant responses are obtained for the questions ID2 and ID6 with respect to the characteristic quantity. Based on the responses, the inference engine 14 infers that the primary factors corresponding to the defect (bridge) are attributed to the items shown by bold lines in FIG. 9A. That is, the possible factor of the bridge is narrowed down to the secondary factors causing "solder bleeding after printing" or "solder crushing after mounting".

Figures 10A, 10B:
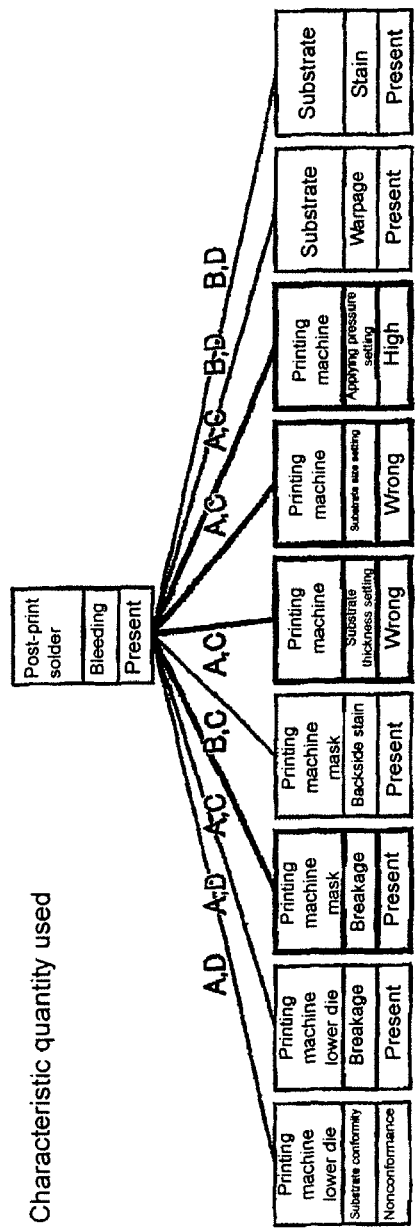
FIGS. 10A and 10B show methods of specifying a primary factor.

FIG. 10 shows a method of specifying the secondary factor. FIG. 10A shows the characteristic quantity in the case where "solder bleeding after printing" is the possible factor of the bridge, and FIG. 10B shows examples of the question sentences presented to the user and of responses from the user in the case of "solder bleeding after printing". Similarly to FIG. 9, the user inputs the responses to the questions IDA to IDD with respect to the characteristic quantity while seeing the inspection image. From the inputted responses, it is found that the questions IDA and IDC are related. Accordingly, it is determined that the secondary factors are the relevant "print machine mask is broken," "print machine substrate thickness setting is wrong," and "print machine applying pressure setting is high."

FIG. 11 shows a method of specifying the secondary factor of "solder crushing after mounting" which is the other factor of the bridge specified in FIG. 9. FIG. 11A shows the characteristic quantity (secondary factor) in the case of "solder crushing after mounting", and FIG. 11B shows examples of question sentences presented to the user and of responses from the user in the case of "solder crushing after mounting". Similarly to FIG. 10, the user inputs responses to the questions IDF to IDJ with respect to the characteristic quantity while seeing the inspection image. Since it is found from the inputted responses that the questions IDF, IDI, and IDJ are related, it is determined that the secondary factors is the relevant "mounter nozzle is clogged".

Thus, the inference engine 14 infers that the "print machine mask is broken," "print machine substrate thickness setting is wrong," "print machine applying pressure setting is high," and "mounter nozzle is clogged" have high probability of the factor of the "bridge".

In the case where there are three or more inputs such as the image inputted from the camera for determination in addition to the determination by the person and the sensor data, the priority is assigned to each input, and the input having the highest priority may be adopted. The determination may be made not by the priority but by majority of the pieces of input data, and the majority result may be adopted for the determination for the characteristic quantity. For example, in the case of "solder shift after printing" (characteristic ID T0001), when the determination made by the person, the language value into which the sensor data is converted, and the image determination made by the camera indicate "FALSE," "TRUE," and "FALSE" respectively, it is determined that "solder shift after printing" is "FALSE."

In the case where a plurality of sensors 23, e.g. two sensors, are provided, when the value of 0.8 is obtained from one of the sensors while the value of 0.7 is obtained from the other sensor, an average value of the pieces of data may be obtained to set the average value to the sensor data. That is, the method of integrating the pieces of data for a plurality of sensors (in this case, average value) is previously determined, and the data integrated according to the integration method may be set to the input data.

Third Embodiment

A third embodiment of the present invention will be described below. The factor estimation apparatus 10 of the third embodiment has the same basic configuration as that of the first embodiment shown in FIG. 1. In the third embodiment, the determination whether the data is inputted from the user or the sensor is made based on the information inputted from the user or the information detected by the inspection apparatus.

For example, the input unit 13 inquires of the user about the user's skill or whether or not the data obtaining device such as a sensor and a camera is provided. The data is automatically (preferentially) inputted from the data obtaining device when the data obtaining device is provided, and the data is inputted from the user when the data obtaining device is not provided. At this point, the input unit 13 functions as a priority determination unit.

FIG. 12A shows an inquiry screen displayed to the user to produce the input source defining table 17. Referring to FIG. 12A, the input unit 13 inquires of the user whether or not the following inspection apparatuses are provided in the substrate mounting line, along with the display of "input utilizable inspection apparatus information and apparatus information". That is, the input unit 13 inquires of the user whether or not the post-print inspection apparatus (inspection image), the post-print inspection apparatus (inspection numerical data), the post-mount inspection apparatus (inspection image), the post-mount inspection apparatus (inspection numerical data), the post-reflow inspection apparatus (inspection image), and the post-reflow inspection apparatus (inspection numerical data) are provided. Additionally, the input unit 13 inquires of the user whether or not a mounter A and a mounter B are provided as the apparatus information. In the third embodiment, each of the inspection apparatuses is displayed with a box, the user selects the boxes of the utilizable inspection apparatus information and apparatus information to input the data.

When the utilizable inspection apparatus is inputted, CPU 11 produces the input source defining table 17 indicating the utilizable data as shown in FIG. 12B. When the data obtaining device such as the inspection apparatus is provided, the data is preferentially inputted from the data obtaining device. When the data obtaining device is not provided, the data is inputted from the user. At this point, CPU 11 functions as a priority determination unit.

Referring to FIG. 12B, in the input source defining table 17, the utilizable inspection apparatus etc. inputted in FIG. 12A is displayed by "available" for each characteristic ID along with the intra-characteristic ID sequence number, the order of priority, and the input source. This enables the utilizable sensor data to be clarified, and it can be determined more securely that the priority is assigned to which one of the data from the person and the data from the sensor according to the device configuration.

Figure 13:
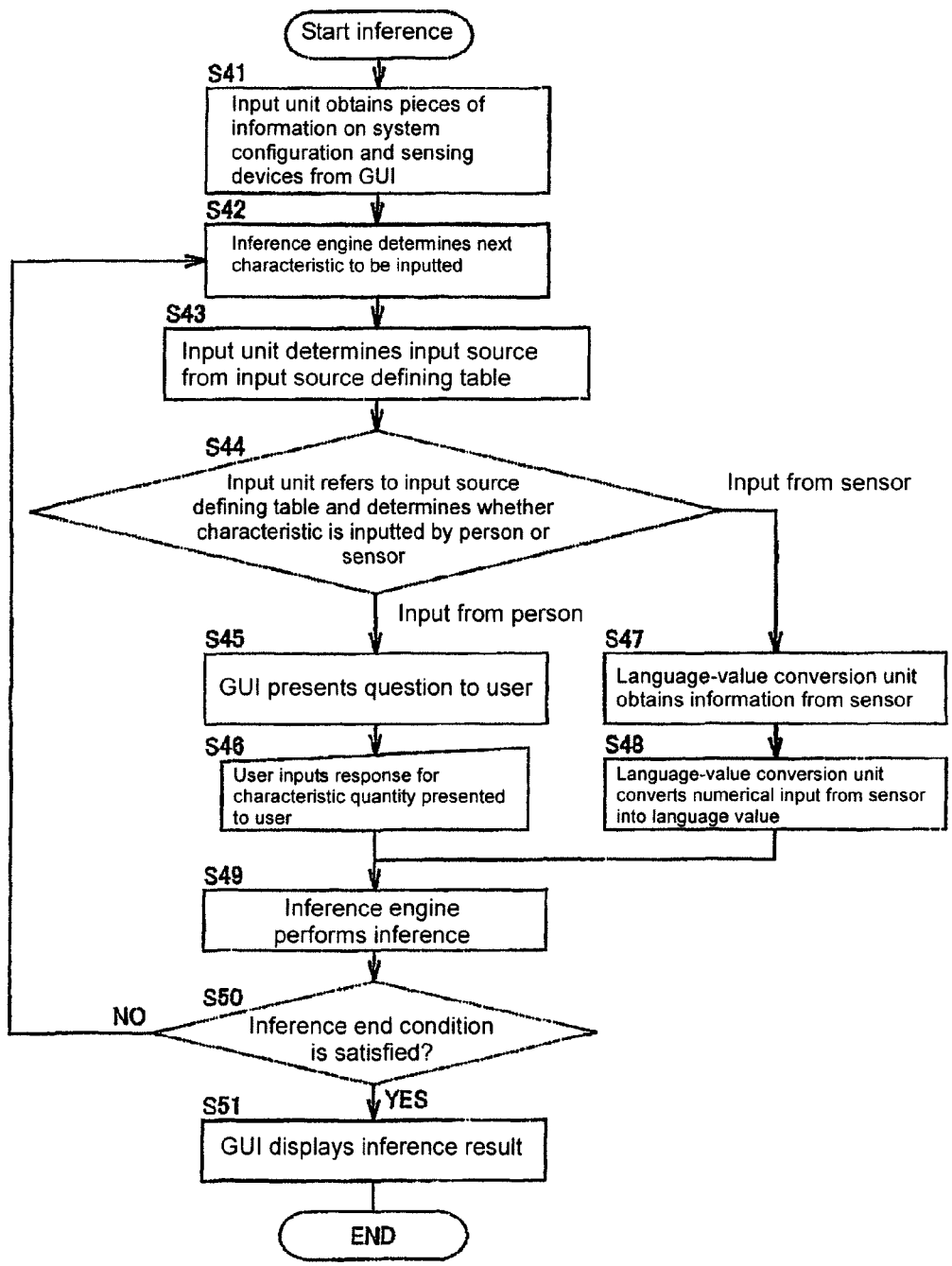
FIG. 13 shows a flowchart of the operation of a factor estimation apparatus according to a third embodiment of the present invention.

Then, the operation in the third embodiment will be described. FIG. 13 shows a flowchart of the operation performed by CPU 11 in the third embodiment. Referring to FIG. 13, in the third embodiment, the input unit 13 obtains the inspection apparatus information shown in FIG. 12A from GUI 12 (S41). The inference engine 14 determines the next characteristic to be inputted (S42). The input unit 13 determines the input source from the input source defining table 17 (S43).

The input unit 13 refers to the input source defining table 17 to determine whether the characteristic is inputted by the person or the sensor (S44). When the characteristic is inputted by the person, GUI 12 presents a question to the user, and the user inputs a response for the characteristic quantity presented to the user (S45 and S46). When the characteristic is inputted by the sensor 23, the language-value conversion unit 18 obtains the information from the sensor 23, and the language-value conversion unit 18 converts the numerical input from the sensor 23 into the language value (S47 and S48).

The inference engine 14 performs inference based on the data from one of the person and the sensor 23. When the inference end condition is satisfied (YES in S50), GUI 12 displays the inference result (S51). When the inference end condition is not satisfied (NO in S50), the process goes on to S43.

In the above embodiments, the user inputs the presence or absence of the inspection apparatus and the information on the mounter. However, the present invention is not limited thereto, and the user's skill may be inputted.

In such cases, for example, the setting of the order of priority can be altered according to the user's skill. When the user (person) is e.g a leader of the substrate mounting line, the user has the sufficiently reliable skill, and the priority is assigned to the determination made by the person rather than the sensor data. On the other hand, when the user is an operator of only one process in the production line, the user's skill is not so reliable, and the priority is assigned to the sensor data. At this point, CPU 11 functions as a reliability determination unit.

The order of priority may be changed depending on, for example, the authority of the user or the role of the user. The authority of the user includes the authority of the operator who is in charge of only one process in the production line and the authority of the leader who is in charge of the production line. The role of the user includes a designer and a production engineer. The skill and the knowledge vary depending on the users. Therefore, such data is previously inputted from the users, based on which it may be determined that which one of the data inputted from the user and the data from the inspection apparatus is assigned priority in the determination of which phenomenon.

It may be configured that the factor estimation apparatus 10 prompts input of the kind of the target system for which the factor is estimated, and that a plurality of inputs are combined according to the kind of the target system.

Therefore, since the input destination is changed according to the level of the user's skill or the target system, the data can be inputted more appropriately.

The factor estimation apparatus 10 may automatically detect the information on the utilizable inspection apparatus.

Fourth Embodiment

A fourth embodiment of the present invention will be described below. In the above embodiments, it is selected whether the data is inputted to the factor estimation apparatus from the person or the sensor. In the fourth embodiment, contents displayed for the user are switched for the input of the data. Specifically, the contents outputted to the user are switched according to an operational phase in view of the focused factor is different depending on the operational phase of the target system for which the factor estimation apparatus estimates the factor.

Figure 14:
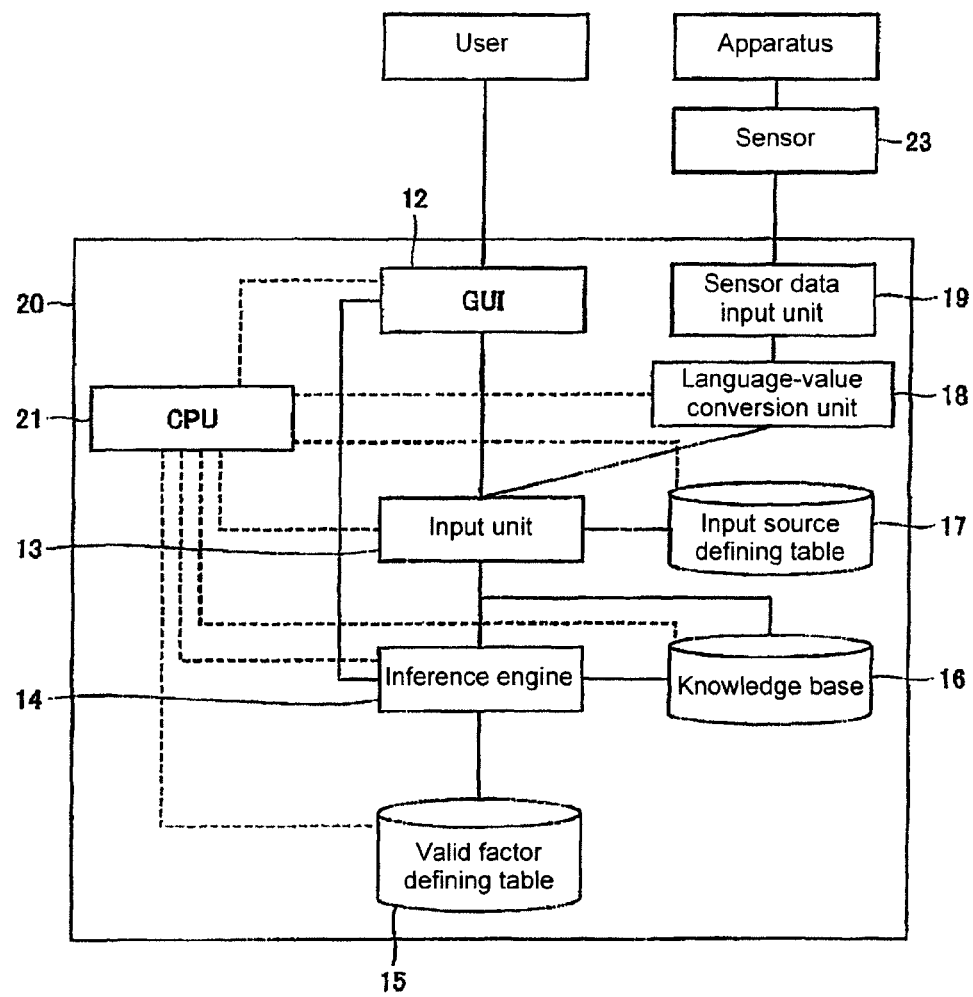
FIG. 14 shows a functional block diagram of a factor estimation apparatus according to a fourth embodiment of the present invention.

FIG. 14 is a functional block diagram showing an essential part of a factor estimation apparatus 20 according to the fourth embodiment of the present invention. Referring to FIG. 14, in the factor estimation apparatus 20 according to the present embodiment, a valid factor defining table 15 is added to the inference engine 14, compared with the factor estimation apparatus 10 shown in FIG. 1. Since the other configuration in the factor estimation apparatus 20 is basically the same as that of the factor estimation apparatus 10 shown in FIG. 1, the same parts are designated by the same reference numerals and the description thereof is omitted.

The target system which estimates the factor is operated in a plurality of operational phases. The valid factor defining table (valid factor defining unit) 15 has the data for outputting which factor for which operational phase. As used herein, the operational phase means a production stage in the production system, and includes a preproduction phase and a mass production phase.

Figures 15A, 15B:
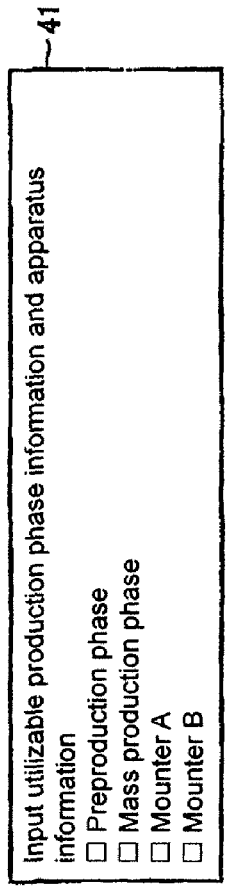
FIGS. 15A and 15B show valid factor defining tables.

FIG. 15 shows the valid factor defining table 15 and the inquiry screen for producing the valid factor defining table 15. The user inputs the operational phase and the usable data obtaining device in the target system on the inquiry screen. FIG. 15A shows the input screen of the production phase and the like. The user can previously determine the production phase through the input screen. Referring to FIG. 15A, the input screen prompts the user to input the usable production phase information and apparatus information, and each phase is displayed with a selection box on the input screen. The user inputs the utilizable phase from the input screen.

At this point, the production phase includes the preproduction phase and the mass production phase, and the mounter A and the mounter B are displayed as the apparatus information on the mounter. The reason why the mounter is included in the production phase is that the usable information differs depending on which mounter is used.

The valid factor defining table 15 shown in FIG. 15B is produced based on the data inputted in FIG. 15A. The valid factor defining table 15 is one in which the inputted operational phase and data obtaining device are stored corresponding to the phenomenon.

Accordingly, GUI 12 functions as an operational phase input unit for causing the user to input the operational phase and data obtaining device in the target system.

Here, the production phase in the production apparatus is described as the operational phase. However, the present invention is not limited thereto, and various operational phases may be included according to the target system for which the factor is estimated.

Figure 16:
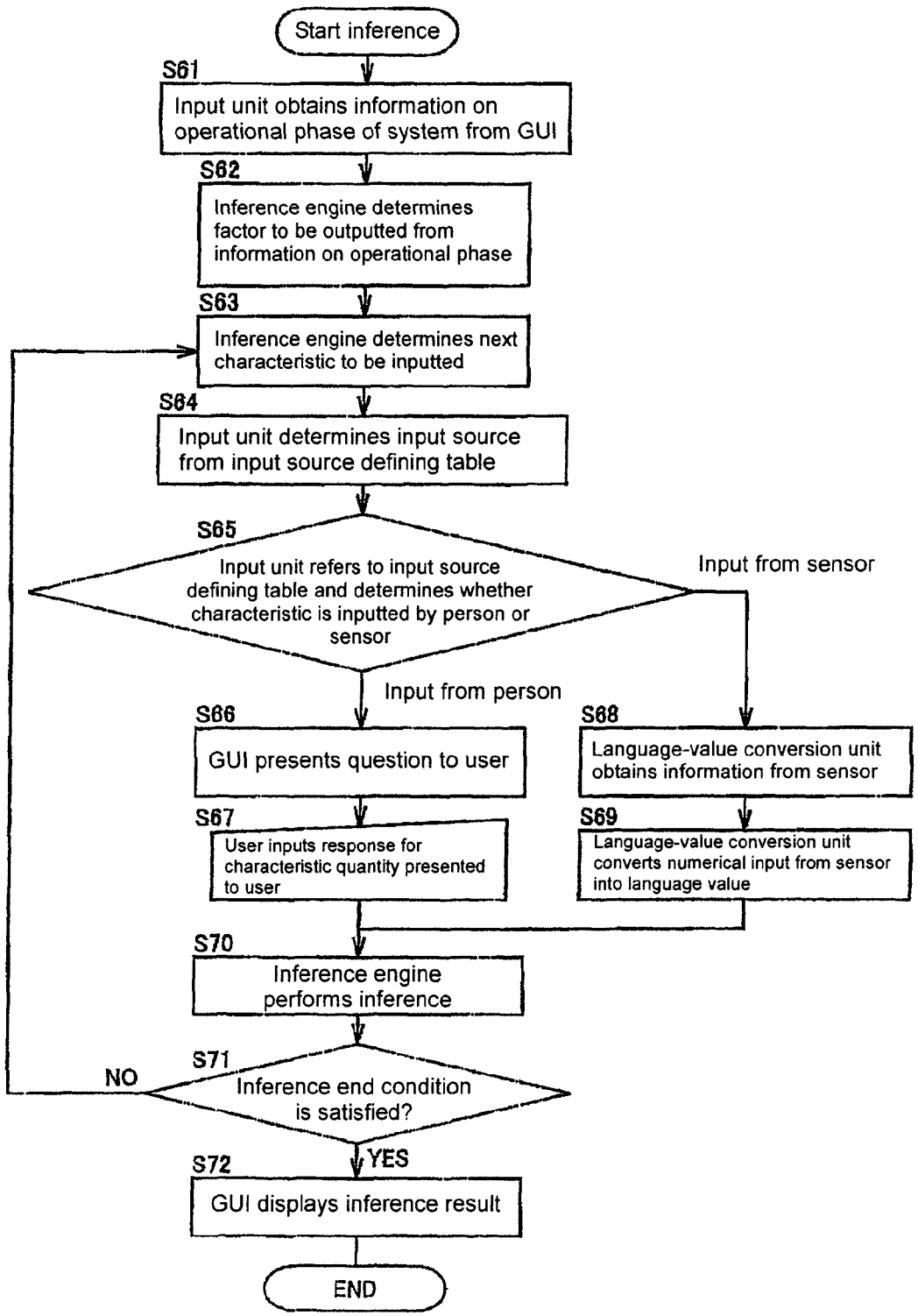
FIG. 16 shows a flowchart of the operation of the factor estimation apparatus according to the fourth embodiment of the present invention.

Then, the operation of CPU 21 in the fourth embodiment will be described. FIG. 16 shows a flowchart for illustrating the operation in the fourth embodiment. Referring to FIG. 16, the input unit 13 obtains the information on, for example, the operational phase of the system from GUI 12 (S61). The inference engine 14 determines the factor to be outputted based on the information on the operational phase and the like (S62). The inference engine 14 determines the next characteristic to be inputted (S63). The input unit 13 determines the input source from the input source defining table 17 (S64). The input unit 13 refers to the input source defining table 17 and determines whether the characteristic is inputted by the person or the sensor 23. When the characteristic is inputted by the person, GUI 12 presents a question to the user, and the user inputs a response for the characteristic quantity presented to the user (S66 and S67).

When the characteristic is inputted by the sensor 23, the language-value conversion unit 18 obtains the information from the sensor 23, and the language-value conversion unit 18 converts the numerical input from the sensor 23 into the language value (S68 and S69).

The inference engine 14 performs inference (S70), and it is determined whether or not the inference end condition is satisfied (S71). When the inference end condition is satisfied (YES in S71), GUI 12 displays the inference result (S72). When the inference end condition is not satisfied (NO in S71), the process returns to S63, and the next data is inputted.

The processing (S62) in which the inference engine 14 determines the factor to be outputted based on the information on the operational phase may be performed subsequent to S70 or prior to S72.

Thus, in the fourth embodiment, the contents outputted to the user are switched according to the operational phase of the system, so that the data can be inputted for performing the factor estimation according to the operational phase of the system.

Next, the description will be made on the contents to be focused in switching the factor to be outputted in the present embodiment.

FIG. 17 illustrates the switch of the characteristic quantities or factors in the valid factor defining table 15. FIG. 17A shows a data structure of an exemplary valid factor defining table 43. The data structure of the valid factor defining table 43 is basically the same as that shown in FIG. 15B. The valid factor defining table 43 includes information 45 having the production phase and apparatus information for each production line and a phase 44 thereof. Additionally, as described later, the valid factor defining table 43 includes a phenomenon ID, a characteristic ID, and data of the order of priority.

FIG. 17B shows the state in which the information 45 having the phenomenon ID, the production phase, and the apparatus information are taken out from FIG. 17A to produce a table indicating a relationship among the phenomenon, the production phase, and the apparatus information. FIG. 17B corresponds to FIG. 15B.

FIG. 17C shows the intra-characteristic ID sequence number, the order of priority, and the obtainable inspection data for each characteristic ID. That is, the correlation between the characteristic ID and the inspection data is recognized at a glance in FIG. 17C.

As shown in FIG. 17A, the valid factor defining table 43 is formed so as to include many pieces of associated information. Therefore, the information for switching the characteristic quantities or factors can be taken out from the valid factor defining table 43 to produce a required valid factor defining table 15.

In the example of FIG. 15, it is necessary that the production phase in which an utilizable inspection apparatus exists be separately selected. On the other hand, in FIG. 17, the table corresponding to FIG. 15A can easily be produced by taking out the associated data from the valid factor defining table 43.

Then, the method of editing the table in which the correlation among the rule data, the characteristic ID, and the inspection data can be recognized at a glance using the valid factor defining table 15 will be described. As shown in FIG. 16, the user inputs the production phase, the inspection apparatus information, and the apparatus information through GUI 12. It is assumed that the data is input as follows. The production phase is the preproduction phase, the post-print inspection apparatus (inspection image, this means the inspection apparatus which can detect the inspection image) is included, and the mounter A is used.

The input source is switched based on the inputted information to narrow down the factor to be the final output.

FIG. 18A shows the valid factor defining table 15, and FIG. 18A is similar to FIG. 15A. In FIG. 18A, phenomenon IDs (P0301 and P0302) 51*a* having pieces of information on the inputted preproduction phase and mounter A can be used, while phenomenon IDs (P0303 and P0304) 51*b* having no piece of information on the preproduction phase and mounter A cannot be used. Therefore, as shown in FIG. 18B, in the rule data 52, the rule 52*a* which introduces the usable phenomenon IDs (P0301 and P0302) is left, while a rule 52*b* which introduces the unusable phenomenon IDs (P0303 and P0304) is unusable and thus deleted.

Similarly, referring to FIG. 18C, a characteristic ID53*a* (intra-characteristic sequence number 1 in T0001) and a characteristic ID54*a* (intra-characteristic sequence number 1 in T0002) which have the post-print inspection apparatus (inspection image) can be used, while a characteristic ID53*b* (intra-characteristic sequence number 2 in T0001) and a characteristic ID54*b* (intra-characteristic sequence number 2 in T0002) which do not have the post-print inspection apparatus (inspection image) are unusable and thus deleted.

Thus, the user inputs the inspection apparatus information or the apparatus information according to the target system for which the factor is estimated, and a necessary valid factor defining table 15 can be produced depending on the inspection apparatus information or the apparatus information.

In the fourth embodiment, the factor to be outputted is switched depending on the operational phase of the target system, and a necessary valid factor defining table is produced. However, the present invention is not limited thereto, and the factor to be outputted may be switched according to the role or authority of the user as described above.

The switch may be made according to the cost in dealing with the factor. For example, when a measure A in which one hour is required and a measure B in which five minutes are required exist as the measure for a certain factor, the factor to be outputted may be switched depending on the time and cost required for taking the measures for the factor.

In the above embodiments, the factor estimation apparatus according to the present invention is applied to the apparatus which estimates the cause of defective contents in the substrate mounting equipment. However, the present invention is not limited thereto, and the present invention may be applied to the apparatus which estimates a desired factor in any piece of equipment or apparatuses.

Although the factor estimation apparatus is the dedicated apparatus in the above embodiments, the present invention is not limited thereto. Alternatively, the apparatus may be realized by a general-purpose personal computer, all the above operations may be programmed, and the personal computer may be operated and used as the factor estimation apparatus by the program. In such cases, the program may be provided in the form of a recording medium such as an optical disk and a hard disk, or the program may be down-loaded from a server over a network.

Although the embodiments of the present invention are described above with reference to the drawings, the present invention is not limited to the embodiments illustrated. Various modifications and changes can be made without departing from the scope and spirit of the invention.

What is claimed is:

1. A factor estimation apparatus which estimates a factor affecting a phenomenon based on data for a characteristic quantity associated with the phenomenon, the factor estimation apparatus comprising:
    a characteristic quantity determination unit configured to determine the characteristic quantity;
    a user input unit configured to accept an input from a user as data for the characteristic quantity determined by the characteristic quantity determination unit;
    an apparatus-data input unit to which data is inputted from a data obtaining device as the data for the characteristic quantity determined by the characteristic quantity determination unit;
    an input source defining unit configured to determine that the data for the characteristic quantity is inputted from the user input unit or the apparatus-data input unit; and
    an estimation unit configured to estimate the factor using the data inputted from the input unit determined by the input source defining unit;
    wherein
        a plurality of characteristic quantities exist,
        the estimation unit is configured to estimate the factor based on the plurality of characteristic quantities, and
        the input source defining unit includes a priority determination unit configured to determine a priority assigned to the data inputted from the user input unit or the apparatus-data input unit for the plurality of characteristic quantities; and
    wherein
        the priority determination unit includes a reliability determination unit configured to determined reliability of the input data of each of the user input unit and the apparatus-data input unit, and
        the priority determination unit is configured to determined the priority assigned to the data inputted from the user input unit or the apparatus-data input unit according to the determination result of the reliability determination unit.

2. A factor estimation apparatus according to claim 1, wherein the reliability determination unit determines the reliability from a skill or a role of a user.

3. A factor estimation apparatus according to claim 1, wherein the input source defining unit is configured to determine that the data is inputted from the user input unit or the apparatus-data input unit for the plurality of characteristic quantities according to a target system for which the factor is estimated.

4. A factor estimation apparatus according to claim 3, wherein
    the target system is operated in a plurality of operational phases,
    the factor estimation apparatus includes an operational phase input unit configured to prompt a user to input the operational phase and the usable data obtaining device in the target system, and
    the factor estimation apparatus includes a valid factor defining unit configured to store the operational phase and the data obtaining device inputted to the operational phase input unit in association with the phenomenon.

5. A factor estimation method of estimating a factor affecting a phenomenon based on data for a characteristic quantity associated with the phenomenon, the factor estimation method comprising the steps of, using at least one computer:
    determining that the data for the characteristic quantity is inputted from a user input unit or a data obtaining device;
    determining the characteristic quantity;
    inputting the data for the characteristic quantity from the determined user input unit or the data obtaining device;
    estimating the factor affecting the phenomenon using the inputted data based on a plurality of the characteristic quantities;
    determining a priority assigned to the data inputted from the user input unit or the data obtaining device for the plurality of characteristic quantities;
    determining reliability of the input data of each of the user input unit and the data obtaining device; and
    determining the priority assigned to the data inputted from the user input unit or the data obtaining device according to the determination result of the reliability determination unit.

6. A non-transitory computer readable recording medium in which a program for making a computer to execute the factor estimation method according to claim 5 is stored.

* * * * *